US008414747B2

(12) United States Patent
Qi et al.

(10) Patent No.: US 8,414,747 B2
(45) Date of Patent: Apr. 9, 2013

(54) HIGH-THROUGHPUT HDP-CVD PROCESSES FOR ADVANCED GAPFILL APPLICATIONS

(75) Inventors: Bo Qi, Sunnyvale, CA (US); Young S. Lee, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 571 days.

(21) Appl. No.: 11/941,263

(22) Filed: Nov. 16, 2007

(65) Prior Publication Data

US 2008/0063813 A1 Mar. 13, 2008

Related U.S. Application Data

(62) Division of application No. 11/031,926, filed on Jan. 8, 2005, now abandoned.

(51) Int. Cl.
*C23C 14/34* (2006.01)

(52) U.S. Cl.
USPC ............ 204/192.23; 204/192.12; 204/192.15; 427/585; 427/588

(58) Field of Classification Search ............... 204/192.1, 204/192.15, 192.12, 192.23; 427/585, 588
See application file for complete search history.

(56) References Cited

U.S. PATENT DOCUMENTS

| | | | |
|---|---|---|---|
| 4,468,413 A | 8/1984 | Bachmann | |
| 4,690,746 A | 9/1987 | McInerney et al. | |
| 4,851,370 A | 7/1989 | Doklan et al. | |

(Continued)

FOREIGN PATENT DOCUMENTS

| | | |
|---|---|---|
| EP | 0 496 543 A2 | 7/1992 |
| JP | 61-276977 | 12/1986 |

(Continued)

OTHER PUBLICATIONS

Abraham, "Reactive Facet Tapering of Plasma Oxide for Multilevel Interconnect Applications," VMIC Conference. pp. (1987).115-121.

(Continued)

*Primary Examiner* — Keith Hendricks
*Assistant Examiner* — Jason M Berman
(74) *Attorney, Agent, or Firm* — Kilpatrick Townsend & Stockton LLP

(57) ABSTRACT

Methods are provided of depositing a silicon oxide film on a substrate disposed in a substrate processing chamber. The substrate has a gap formed between adjacent raised surfaces. A silicon-containing gas, an oxygen-containing gas, and a fluent gas are flowed into the substrate processing chamber. The fluent gas has an average molecular weight less than 5 amu. A first high-density plasma is formed from the silicon-containing gas, the oxygen-containing gas, and the fluent gas to deposit a first portion of the silicon oxide film over the substrate and within the gap with a first deposition process that has simultaneous deposition and sputtering components having relative contributions defined by a first deposition/sputter ratio. A second high-density plasma is formed from the silicon-containing gas, the oxygen-containing gas, and the fluent gas to deposit a second portion of the silicon oxide film over the substrate and within the gap with a second deposition process that has simultaneous deposition and sputtering components having relative contributions defined by a second deposition/sputter ratio. The second deposition/sputter ratio is less than the first deposition/sputter ratio. Each of the first and second deposition/sputter ratios is defined as a ratio of a sum of a net deposition rate and a blanket sputtering rate to the blanket sputtering rate.

11 Claims, 9 Drawing Sheets

U.S. PATENT DOCUMENTS

| | | | |
|---|---|---|---|
| 4,872,947 | A | 10/1989 | Wang et al. |
| 4,892,753 | A | 1/1990 | Wang et al. |
| 4,894,352 | A | 1/1990 | Lane et al. |
| 4,960,488 | A | 10/1990 | Law et al. |
| 5,000,113 | A | 3/1991 | Wang et al. |
| 5,013,691 | A | 5/1991 | Lory et al. |
| 5,089,442 | A | 2/1992 | Olmer |
| 5,156,881 | A | 10/1992 | Okano et al. |
| 5,215,787 | A | 6/1993 | Homma |
| 5,271,972 | A | 12/1993 | Kwok et al. |
| 5,275,977 | A | 1/1994 | Otsubo et al. |
| 5,279,865 | A | 1/1994 | Chebi et al. |
| 5,288,518 | A | 2/1994 | Homma |
| 5,302,233 | A | 4/1994 | Kim et al. |
| 5,314,724 | A | 5/1994 | Tsukune et al. |
| 5,319,247 | A | 6/1994 | Matsuura |
| 5,334,552 | A | 8/1994 | Homma |
| 5,362,526 | A | 11/1994 | Wang et al. |
| 5,385,763 | A | 1/1995 | Okano et al. |
| 5,399,529 | A | 3/1995 | Homma |
| 5,413,967 | A | 5/1995 | Matsuda et al. |
| 5,416,048 | A | 5/1995 | Blalock et al. |
| 5,420,075 | A | 5/1995 | Homma et al. |
| 5,429,995 | A | 7/1995 | Nishiyama et al. |
| 5,468,342 | A | 11/1995 | Nulty et al. |
| 5,474,589 | A | 12/1995 | Ohga et al. |
| 5,563,105 | A | 10/1996 | Dobuzinsky et al. |
| 5,571,576 | A | 11/1996 | Qian et al. |
| 5,599,740 | A | 2/1997 | Jang et al. |
| 5,624,582 | A | 4/1997 | Cain |
| 5,648,175 | A | 7/1997 | Russell et al. |
| 5,661,093 | A | 8/1997 | Ravi et al. |
| 5,679,606 | A | 10/1997 | Wang et al. |
| 5,719,085 | A | 2/1998 | Moon et al. |
| 5,850,105 | A | 12/1998 | Dawson et al. |
| 5,858,876 | A | 1/1999 | Chew |
| 5,872,052 | A | 2/1999 | Iyer |
| 5,872,058 | A | 2/1999 | Van Cleemput et al. |
| 5,913,140 | A | 6/1999 | Roche et al. |
| 5,915,190 | A | 6/1999 | Pirkle |
| 5,937,323 | A | 8/1999 | Orczyk et al. |
| 5,939,831 | A | 8/1999 | Fong et al. |
| 5,944,902 | A | 8/1999 | Redeker et al. |
| 5,953,635 | A | 9/1999 | Andideh |
| 5,968,610 | A | 10/1999 | Liu et al. |
| 5,990,000 | A | 11/1999 | Hong et al. |
| 6,030,881 | A * | 2/2000 | Papasouliotis et al. ........ 438/424 |
| 6,037,018 | A | 3/2000 | Jang et al. |
| 6,039,851 | A | 3/2000 | Iyer |
| 6,059,643 | A | 5/2000 | Hu et al. |
| 6,136,685 | A | 10/2000 | Narwankar et al. |
| 6,167,834 | B1 | 1/2001 | Wang et al. |
| 6,170,428 | B1 | 1/2001 | Redeker et al. |
| 6,182,602 | B1 | 2/2001 | Redeker et al. |
| 6,189,483 | B1 | 2/2001 | Ishikawa et al. |
| 6,191,026 | B1 | 2/2001 | Rana et al. |
| 6,194,038 | B1 | 2/2001 | Rossman |
| 6,197,705 | B1 | 3/2001 | Vassiliev |
| 6,203,863 | B1 | 3/2001 | Liu et al. |
| 6,204,200 | B1 | 3/2001 | Shieh et al. |
| 6,335,288 | B1 | 1/2002 | Kwan et al. |
| 6,395,150 | B1 * | 5/2002 | Van Cleemput et al. 204/192.37 |
| 6,503,843 | B1 | 1/2003 | Xia et al. |
| 6,596,654 | B1 | 7/2003 | Bayman et al. |
| 6,808,748 | B2 | 10/2004 | Kapoor et al. |
| 7,163,896 | B1 * | 1/2007 | Zhu et al. ....................... 438/694 |
| 2002/0187655 | A1 | 12/2002 | Tan |
| 2003/0003244 | A1 * | 1/2003 | Rossman ....................... 427/569 |
| 2005/0073671 | A1 | 4/2005 | Borodovsky |
| 2005/0074698 | A1 | 4/2005 | Borodovsky |
| 2005/0083497 | A1 | 4/2005 | Borodovsky |
| 2005/0085085 | A1 | 4/2005 | Borodovsky |
| 2005/0088633 | A1 | 4/2005 | Borodovsky |
| 2006/0017910 | A1 | 1/2006 | Borodovsky |
| 2006/0154494 | A1 | 7/2006 | Qi |

FOREIGN PATENT DOCUMENTS

| | | |
|---|---|---|
| JP | 2058836 A | 2/1990 |
| JP | 4-341568 | 11/1992 |
| JP | 7-161703 A | 6/1995 |
| WO | WO 92/20833 | 11/1992 |

OTHER PUBLICATIONS

Chang et al. "Frequency Effects and Properties of Plasma Deposited Fluorinated Silicon Nitride", American Vacuum Society. 1988. pp. 524-532.

Fukada et al. "Preparation of SiOF Films with Low Dielectric Constant by ECR Plasma CVD", Japan. DUMIC Conference. Feb. 1995. pp. 43-49.

Galiano et al. "Stress-Temperature Behavior of Oxide Films Used for Intermetal Dielectric Applications", VMIC Conference. Jun. 1992. pp. 100-106.

Hayasaka, N. et al. "High Quality Low Dielectric Constant SiO2 CVD Using High Density Plasma," Proceedings of the Dry Process Symposium, 1993, pp. 163-168.

Laxman, "Low ϵ Dielectrics: CVD Fluorinated Silicon Dioxides", Semiconductor International. May 1995. pp. 71-74.

Lee et al., "Dielectric Planarization Techniques for Narrow Pitch Multilevel Interconnects," VMIC Conference, pp. 85-92 (1987).

Matsuda et al. "Dual Frequency Plasma CVD Fluorosilicate Glass: Deposition for 0.25 um Interlevel Dielectrics", DUMIC Conference. Feb. 1995. pp. 22-28.

Meeks et al., "Modeling of SiO2 deposition in high density plasma reactors and comparisons of model predictions with experimental measurements," J. Vac. Sci. Technol. A, 16(2):544-563 (1998).

Musaka, "Single Step Gap Filling Technology of Subhalf Micron Metal Spacings on Plasma Enhanced TEOS/O2 Chemical Vapor Deposition System," International Conference on Solid State Devices and Materials pp. 510-512, held in Japan, (1993).

Qian et al., "High Density Plasma Deposition and Deep Submicron Gap Fill with Low Dielectric Constant SiOF Films," DUMIC Conference, pp. 50-56, held in California (1995).

Robles et al. "Effects of RF Frequency and Deposition Rates on the Moisture Resistance of PECVD TEOS-Based Oxide Films", ECS Extended Abstracts. vol. 92-1. May 1992. pp. 215-216.

Shapiro et al. "Dual Frequency Plasma CVD Fluorosilicate Glass: Water Absorption and Stability", DUMIC Conference. Feb. 1995. pp. 118-123.

Usami et al. "Low Dielectric Constant Interlayer Using Fluorine-Doped Silicon Oxide", Jpn. J. Appl. Phys. vol. 33, Jan. 1994. pp. 408-412.

Vassilliev et al., "Trends in void-free pre-metal CVD dielectrics," *Solid State Technology*, 2001, pp. 129-136, www.solid-state.com.

Yu et al. "Step Coverage Study of Peteos Deposition for Intermetal Dielectric Applications", VMIC Conference. Jun. 1990. pp. 166-172.

Non-Final Office Action for U.S. Appl. No. 11/031,926 mailed on May 17, 2007; 12 pages.

Ehrlich, D. J. et al., "Submicrometer Patterning by Projected Excimer-Laser-Beam Induced Chemistry," J. Vac. Sci. Technol. B, vol. 3 No. 1, pp. 1-8, Jan./Feb. 1985.

Farsari, M. et al., "Fabrication of Three-Dimensional Structures by Three-Photon Polymerization," Optics Letters, vol. 30, No. 23, pp. 3180-3182, Dec. 1, 2005.

Gelbart, Dan et al., "UV Thermoresists: Sub 100nm Imaging Without Proximity Effects," SPIE, vol. 3676, pp. 786-793, Mar. 1999.

Lin, Chih-Lang et al., "Velocimetry Microsensors Driven by Linearly Polarized Optical Tweezers," Optics Letters, vol. 31, No. 3, pp. 329-331, Feb. 1, 2006.

Pang, S. W. et al., "Aluminum Oxides as Imaging Materials for 193-nm Excimer Lithography," J. Vac. Sci. Technol. B., vol. 7, No. 6, pp. 1624-1628, Nov./Dec. 1989.

Poonawala, Amyn et al., "ILT for Double Exposure Lithography With Conventional and Novel Materials," Proc. of SPIE, vol. 6520, pp. 65202Q-1-65202Q-14, 2007.

Rothschild, M. et al., "A Review of Excimer Laser Projection Lithography," J. Vac. Sci. Technol. B, vol. 6, No. 1, pp. 1-17, Jan./Feb. 1988.

Van den hove, Luc et al., "Lithography Options for the 32nm Half Pitch Node," imec, 50 pages, 2006.

Walsh, Michael E., "Nanostructuring Magnetic Thin Films Using Interference Lithography," Massachusetts Institute of Technology, 86 pages, Aug. 2000.

Walsh, Michael E., "On the Design of Lithographic Interferometers and Their Application," Massachusetts Institute of Technology, 300 pages, Sep. 2004.

Yin, Xiaobo et al., "Near-Field Two-Photon Nanolithography Using an Apertureless Optical Probe," Applied Physics Letters, vol. 81, No. 19, pp. 3663-3665, Nov. 4, 2002.

* cited by examiner

HIGH-THROUGHPUT HDP-CVD PROCESSES FOR ADVANCED GAPFILL APPLICATIONS

CROSS-REFERENCE TO RELATED APPLICATION

This application is a divisional of U.S. patent application Ser. No. 11/031,926, entitled "HIGH THROUGHPUT HDP-CVD PROCESSES FOR ADVANCED GAPFILL APPLICATIONS," filed Jan. 8, 2005 by Bo Qi et al, the entire disclosure of which is incorporated herein by reference for all purposes.

BACKGROUND OF THE INVENTION

One of the persistent challenges faced in the development of semiconductor technology is the desire to increase the density of circuit elements and interconnections on substrates without introducing spurious interactions between them. Unwanted interactions are typically prevented by providing gaps or trenches that are filled with electrically insulative material to isolate the elements both physically and electrically. As circuit densities increase, however, the widths of these gaps decrease, increasing their aspect ratios and making it progressively more difficult to fill the gaps without leaving voids. The formation of voids when the gap is not filled completely is undesirable because they may adversely affect operation of the completed device, such as by trapping impurities within the insulative material.

Common techniques that are used in such gapfill applications are chemical-vapor deposition ("CVD") techniques. Conventional thermal CVD processes supply reactive gases to the substrate surface where heat-induced chemical reactions take place to produce a desired film. Plasma-enhanced CVD ("PECVD") techniques promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes when compared with conventional thermal CVD processes. These advantages may be further exploited by high-density-plasma ("HDP") CVD techniques, in which a dense plasma is formed at low vacuum pressures so that the plasma species are even more reactive. While each of these techniques falls broadly under the umbrella of "CVD techniques," each of them has characteristic properties that make them more or less suitable for certain specific applications.

HDP-CVD systems form a plasma that is at least approximately two orders of magnitude greater than the density of a standard, capacitively coupled plasma CVD system. Examples of HDP-CVD systems include inductively coupled plasma systems and electron cyclotron resonance (ECR) plasma systems, among others. HDP-CVD systems generally operate at lower pressure ranges than low-density plasma systems. The low chamber pressure employed in HDP-CVD systems provides active species having a long mean-free-path and reduced angular distribution. These factors, in combination with the plasma density, contribute to a significant number of constituents from the plasma reaching even the deepest portions of closely spaced gaps, providing a film with improved gapfill capabilities compared with films deposited in a low-density plasma CVD system.

Another factor that allows films deposited by HDP-CVD techniques to have improved gapfill characteristics is the promotion of sputtering by the high density of the plasma, simultaneous with film deposition. The sputtering component of HDP deposition processes slows deposition on certain features, such as the corners of raised surfaces, thereby contributing to the increased gapfill ability of HDP deposited films. Some HDP-CVD systems introduce argon or a similar heavy inert gas to further promote the sputtering effect. These HDP-CVD systems typically employ an electrode within the substrate support pedestal that enables the creation of an electric field to bias the plasma towards the substrate. The electric field can be applied throughout the HDP deposition process for further promotion of sputtering and to provide better gapfill characteristics for a given film.

It was initially thought that because of their simultaneous deposition/sputter nature, HDP-CVD processes could fill the gaps or trenches that were created in almost any application. Semiconductor manufacturers have discovered, however, that there is a practical limit to the aspect ratio of gaps that HDP-CVD processes are able to fill. For example, one HDP-CVD process commonly used to deposit a silicon oxide gapfill film forms a plasma from a process gas that includes silane $SiH_4$, molecular oxygen $O_2$, and argon Ar. It has been reported that when such a process is used to fill certain narrow-width high-aspect-ratio gaps, the sputtering caused by argon in the process gas may hamper the gapfill efforts. Specifically, it has been reported that material sputtered by argon in the process redeposits on the upper portions of the sidewalls of the gaps being filled at a rate faster than at the lower portions. This, in turn, may result in the formation of a void in the gap if the upper areas of regrowth join before the gap is completely filled.

FIG. 1 provides schematic cross-sectional views of a silicon oxide film at different stages of deposition to illustrate the potential gapfill limitation associated with some CVD processes. The gapfill problem is illustrated in somewhat exaggerated form to illustrate the problem better. The top portion of FIG. 1 shows the initial structure 104 in which a gap 120 is defined by two adjacent features 124 and 128 having horizontal surfaces 122, with the horizontal surface at the bottom of the gap being denoted 132. As shown in structure 108, i.e. the second portion of the figure from the top, a conventional HDP-CVD silicon oxide deposition process results in direct deposition on the horizontal surface 132 at the bottom of the gap 120 and on the horizontal surfaces 122 above the features 124 and 128. It also, however, results in indirect deposition (referred to as "redeposition") on the sidewalls 140 of the gap 120 due to recombination of material sputtered from the silicon oxide film as it grows. In certain small-width, high-aspect-ratio applications, the continued growth of the silicon oxide film results in formations 136 on the upper section of the sidewall 140 that grow towards each other at a rate of growth exceeding the rate at which the film grows laterally on the lower portions of the sidewall. This trend is shown in structures 108 and 112, with the final result in structure 116 being the formation of a void 144 within the film. The probability of forming a void is very directly related to the rate and character of the redeposition.

There accordingly remains a general need in the art for improving gapfill techniques.

BRIEF SUMMARY OF THE INVENTION

Embodiments of the invention provide methods of depositing a silicon oxide film that improve gapfill capabilities. Some embodiments that are especially suitable for substrates that have both dense and open areas and fill part of the gaps with an initially higher deposition contribution from an HDP-CVD process, followed by a lower deposition contribution to fill a further portion of the gaps. Other embodiments make use of an unexpected chemical effect with a hydrogen-based plasma to remove material intermediate between deposition phases to reopen the gap before formation of a void. In some instances, these embodiments overlap with certain processes making use of both aspects.

Thus, in a first set of embodiments, a method is provided of depositing a silicon oxide film on a substrate disposed in a substrate processing chamber. The substrate has a gap formed between adjacent raised surfaces. A silicon-containing gas, an oxygen-containing gas, and a fluent gas are flowed into the substrate processing chamber. The fluent gas has an average molecular weight less than 5 amu. A first high-density plasma is formed from the silicon-containing gas, the oxygen-containing gas, and the fluent gas to deposit a first portion of the silicon oxide film over the substrate and within the gap with a first deposition process that has simultaneous deposition and sputtering components having relative contributions defined by a first deposition/sputter ratio. A second high-density plasma is formed from the silicon-containing gas, the oxygen-containing gas, and the fluent gas to deposit a second portion of the silicon oxide film over the substrate and within the gap with a second deposition process that has simultaneous deposition and sputtering components having relative contributions defined by a second deposition/sputter ratio. The second deposition/sputter ratio is less than the first deposition/sputter ratio. Each of the first and second deposition/sputter ratios is defined as a ratio of a sum of a net deposition rate and a blanket sputtering rate to the blanket sputtering rate.

In some embodiments, the first deposition/sputter ratio is between 20 and 100. Also in some embodiments, the second deposition/sputter ratio is less than 10. The second high-density plasma may be formed by changing process conditions without extinguishing the first high-density plasma. The fluent gas may comprise molecular hydrogen $H_2$ and may be flowed into the substrate processing chamber with a flow rate greater than 500 sccm. In another embodiment, the fluent gas comprises helium He. The silicon-containing gas may comprise monosilane $SiH_4$ and the oxygen-containing gas may comprise molecular oxygen $O_2$. In one embodiment, the first portion of the silicon oxide film reduces a depth of the gap by less than 50%. In some instances, the gap may comprise a plurality of gaps formed between adjacent raised surfaces, with a first of the gaps having a width at least five times a width of a second of the gaps.

In a second set of embodiments, a method is also provided for depositing a silicon oxide film on a substrate disposed in a substrate processing chamber. The substrate has a gap formed between adjacent raised surfaces. A flow of a first gaseous mixture is provided to the substrate processing chamber. The first gaseous mixture comprises a flow of a silicon-containing gas, a flow of an oxygen-containing gas, and a flow of a fluent gas. A first high-density plasma is formed from the first gaseous mixture to deposit a first portion of the silicon oxide film over the substrate and within the gap with a first deposition process that has simultaneous deposition and sputtering components. The first portion of the silicon oxide film is exposed to a second high-density plasma formed with a flow of gases having an average molecular weight less than 5 amu and including a flow of molecular hydrogen $H_2$. Thereafter, a flow of a second gaseous mixture is provided to the substrate processing chamber. The flow of the second gaseous mixture comprises a flow of a silicon-containing gas, a flow of an oxygen-containing gas, and a flow of a fluent gas. A third high-density plasma is formed from the second gaseous mixture to deposit a second portion of the silicon oxide film over the substrate and within the gap with a second deposition process that has simultaneous deposition and sputtering components.

In some such embodiments, the second high-density plasma is formed with a flow that consists essentially of molecular hydrogen $H_2$. The first portion may be exposed to the second high-density plasma by terminating the flow of the silicon-containing gas and the flow of the oxygen-containing gas comprised by the flow of the first gaseous mixture. In addition, the flow of the second gaseous mixture may be provided by reinitiating the terminated flow of the silicon-containing gas and the terminated flow of the oxygen-containing gas. The flow rate of molecular hydrogen $H_2$ may be provided at a rate greater than 500 sccm in some embodiments, and may be provided at a rate greater than 1000 sccm in other embodiments.

The process may be cycled repeatedly. For example, in one embodiment, the second portion of the silicon oxide film is exposed to a fourth high-density plasma formed with a flow of gases having an average molecular weight less than 5 amu and including a flow of molecular hydrogen. Thereafter, a flow of a third gaseous mixture is provided to the substrate processing chamber. The flow of the third gaseous mixture comprises a flow of a silicon-containing gas, a flow of an oxygen-containing gas, and a flow of a fluent gas. A fifth high-density plasma is formed from the third gaseous mixture to deposit a third portion of the silicon oxide film over the substrate and within the gap with a third deposition process that has simultaneous deposition and sputtering components.

In addition, relative deposition and sputtering contributions may be varied during different depositions. For example the first deposition process may comprise relative deposition and sputtering contributions defined by a first deposition/sputter ratio between 20 and 100, and the second deposition process may comprise deposition and sputtering contributions defined by a second deposition/sputter ratio less than 10. In other instance, the first deposition process may comprise a first part having relative deposition and sputtering contributions defined by a first deposition/sputter ratio between 20 and 100, followed by a second part having relative deposition and sputtering contributions defined by a second deposition/sputter ratio less than 10. Similarly, the second deposition process may comprise a first part having relative deposition and sputtering contributions defined by a first deposition/sputter ratio between 20 and 100, followed by a second part having relative deposition and sputtering contributions defined by a second deposition/sputter ratio less than 10.

A further understanding of the nature and advantages of the present invention may be realized by reference to the remaining portions of the specification and the drawings.

DETAILED DESCRIPTION OF THE INVENTION

Embodiments of the invention are directed to methods of depositing a silicon oxide layer to fill a gap in a surface of a substrate using a high-density-plasma CVD process. Silicon oxide films deposited according to the techniques of the invention have excellent gapfill capabilities and are able to fill gaps encountered in, for example, shallow-trench-isolation ("STI") structures. Films deposited by the methods of the invention are thus suitable for use in the fabrication of a variety of integrated circuits.

Figure 1:
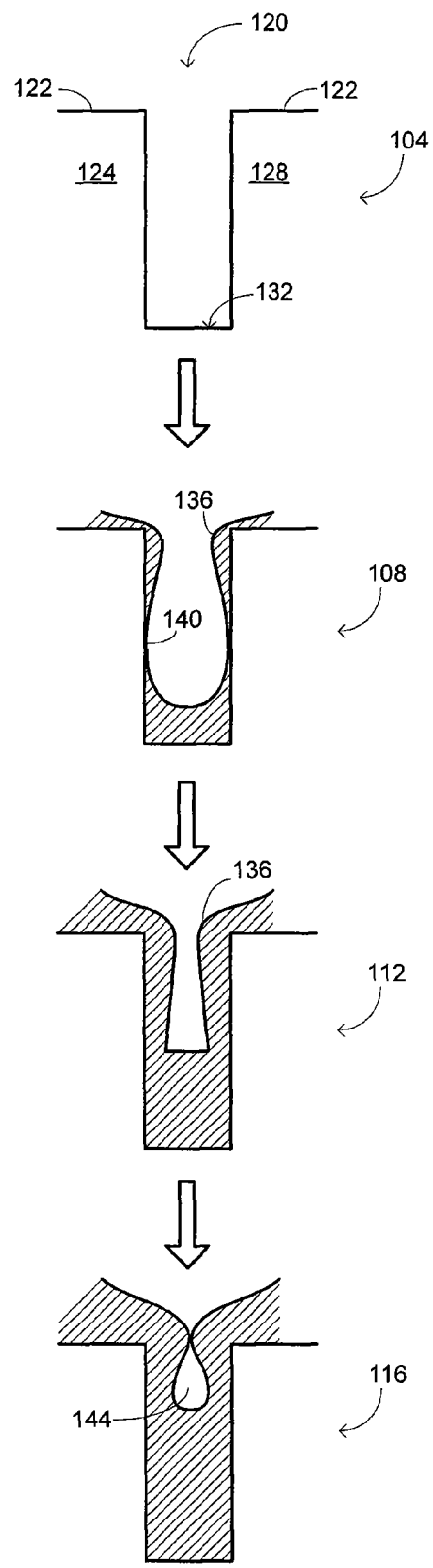
FIG. 1 provides schematic cross-sectional drawings illustrating the formation of a void during a prior-art gapfill process.
Figure 2:
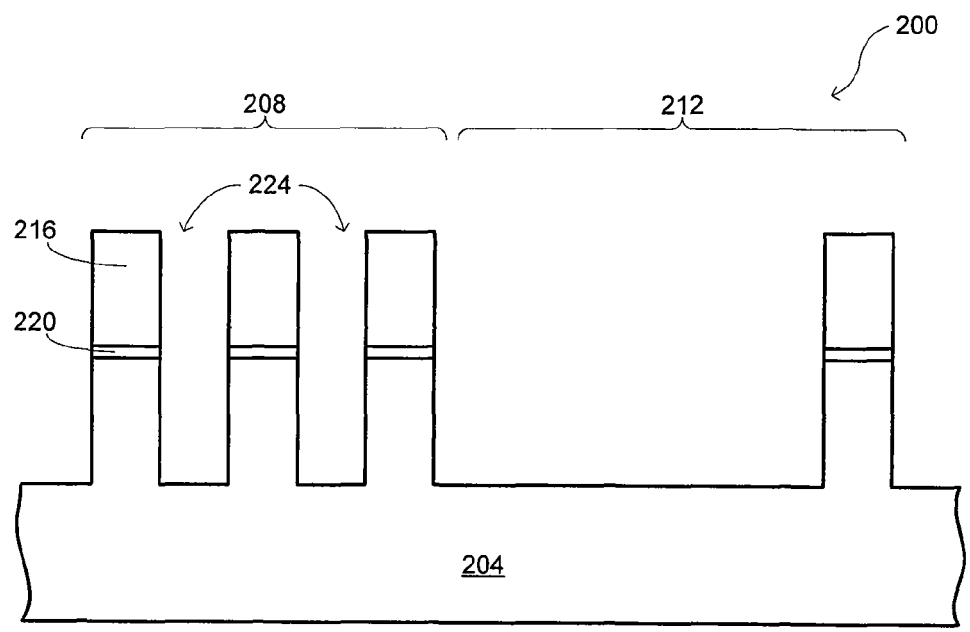
FIG. 2 is a simplified cross-sectional view of a partially completed integrated circuit that includes a plurality of shallow-trench-isolation structures.

The types of structures that may be filled according to embodiments of the invention are illustrated by FIG. 2, which provides a simplified cross-sectional view of a partially completed integrated circuit 200. This integrated circuit is formed over a substrate 204 that includes a plurality of STI structures, each of which is typically created by forming a thin pad oxide layer 220 over the surface of the substrate 204 and then forming a silicon nitride layer 216 over the pad oxide layer 220. The nitride and oxide layers are then patterned using standard photolithography techniques and trenches 224 are etched through the nitride/oxide stack into the substrate 204. FIG. 2 shows that the integrated circuit may comprise areas 208 that are relatively densely packed with transistors or other active devices, and may comprise open areas 212 that are relatively isolated. Active devices in the open areas 212 may be separated from each other by more than an order of magnitude than separations in the densely packed areas 208, but as used herein "open areas" are considered to be areas in which gaps have a width at least five times a width of a gap in a "dense area."

Embodiments of the invention provide methods for filling the trenches 224 with an electrically insulating material such as silicon dioxide using a deposition process that has good gapfill properties. Different embodiments of the invention are more suitable for filling gaps in the open areas, while other embodiments of the invention are especially suitable for filling the very high aspect-ratio gaps in the dense areas. In some instances, the gapfill characteristics provided by the methods described below have good gapfill capabilities in both the open and dense areas, making such techniques especially valuable for certain applications. In some instances, prior to the gapfill process, an initial lining layer is deposited over the substrate as an in situ steam generation ("ISSG") or other thermal oxide layer, or perhaps a silicon nitride layer. One benefit to depositing such a liner prior to filling the trenches 224 is to provide appropriate corner rounding, which may aid in avoiding such effects as early gate breakdown in transistors that are formed. In addition, such a liner may aid in relieving stress after the CVD deposition.

As used herein, a high-density-plasma process is a plasma CVD process that includes simultaneous deposition and sputtering components and that employs a plasma having an ion density on the order of $10^{11}$ ions/cm$^3$ or greater. The relative levels of the combined deposition and sputtering characteristics of the high-density plasma may depend on such factors as the flow rates used to provide the gaseous mixture, the source power levels applied to maintain the plasma, the bias power applied to the substrate, and the like. The combination of such factors may conveniently be quantified with a "deposition/sputter ratio," sometimes denoted D/S to characterize the process:

$$\frac{D}{S} \equiv \frac{\text{(net deposition rate)} + \text{(blanket sputtering rate)}}{\text{(blanket sputtering rate)}}.$$

The deposition/sputter ratio increases with increased deposition and decreases with increased sputtering. As used in the definition of D/S, the "net deposition rate" refers to the deposition rate that is measured when deposition and sputtering are occurring simultaneously. The "blanket sputter rate" is the sputter rate measured when the process recipe is run without deposition gases; the pressure within the process chamber is adjusted to the pressure during deposition and the sputter rate measured on a blanket thermal oxide.

Other equivalent measures may be used to quantify the relative deposition and sputtering contributions of the HDP process, as is known to those of skill in the art. A common alternative ratio is the "etching/deposition ratio,"

$$\frac{E}{D} \equiv \frac{\text{(source-only deposition rate)} - \text{(net deposition rate)}}{\text{(source-only deposition rate)}},$$

which increases with increased sputtering and decreases with increased deposition. As used in the definition of E/D, the "net deposition rate" again refers to the deposition rate measured when deposition and sputtering are occurring simultaneously. The "source-only deposition rate," however, refers to the deposition rate that is measured when the process recipe is run with no sputtering. Embodiments of the invention are described herein in terms of D/S ratios. While D/S and E/D are not precise reciprocals, they are inversely related and conversion between them will be understood to those of skill in the art.

The desired D/S ratios for a given step in the HDP-CVD processes are generally achieved by including flows of precursor gases and, in some instances, flows of a fluent gas, which may also act as a sputtering agent. The elements comprised by the precursor gases react to form the film with the desired composition. For example, to deposit a silicon oxide film, the precursor gases may include a silicon-containing gas, such as silane SiH$_4$, and an oxidizing gas reactant such as molecular oxygen O$_2$. Dopants may be added to the film by including a precursor gas with the desired dopant, such as by including a flow of SiF$_4$ to fluorinate the film, including a flow of PH$_3$ to phosphorate the film, including a flow of B$_2$H$_6$ to boronate the film, including a flow of N$_2$ to nitrogenate the film, and the like. The fluent gas may be provided with a flow of H$_2$ or with a flow of an inert gas, including a flow of He, or even a flow a heavier inert gas, such as Ne, Ar, or Xe. The level of sputtering provided by the different fluent gases is inversely related to their atomic mass (or molecular mass in the case of H$_2$), with H$_2$ producing even less sputtering than He. Embodiments of the invention generally provide fluent-gas flows that have an average molecular mass less than 5 amu. This may be achieved by using flows of a single low-mass gas, such as with a flow of substantially pure H$_2$ or with a flow of substantially pure He. Alternatively, flows may sometimes be provided of multiple gases, such as by providing both a flow of $H_2$ and a flow of He, which mix in the HDP-CVD process chamber. Alternatively, the gas may sometimes be premixed so that a flow of $H_2$/He is provided in a mixed state to the process chamber. It is also possible to provide separate flows of higher-mass gases, or to include higher-mass gases in the premixture, with the relative flow rates and/or concentrations of the premixture being selected to maintain an average molecular mass less than 5 amu.

In high-aspect-ratio structures, the use of relatively high flow rates of low-mass fluent gases has been found generally to improve gapfill capability when compared with the more traditional use of fluent gases such as Ar. This is believed to be a consequence of the reduction in redeposition that is achieved by using He or $H_2$ as a fluent gas so that closure of the gap occurs less quickly. The inventors have discovered, however, that the use of such a low-mass fluent gas results in increased corner clipping in open regions. This effect may be understood with reference to FIGS. 3A and 3B, which show the effect of the sputtering component of an HDP process respectively for a gap in a densely packed area and for a gap in an open area.

Figure 3A:
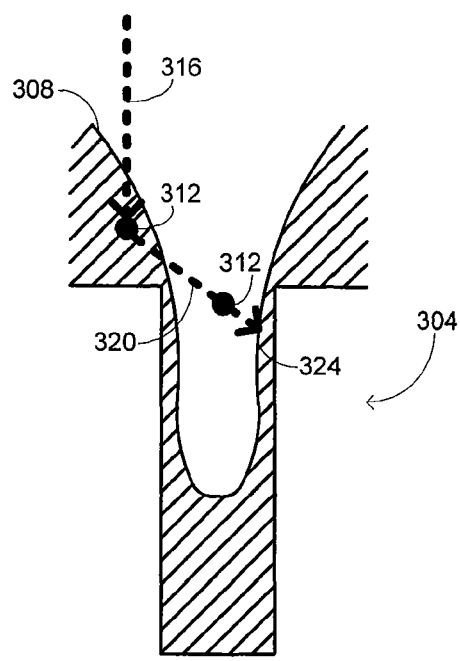
FIGS. 3A and 3B are schematic diagrams that respectively illustrated gapfill characteristics of densely packed areas and open areas in a structure.

In particular, the gap 304 in FIG. 3A is a high-aspect-ratio gap, with the material deposited using an HDP-CVD process forming a characteristic cusp structure 308 over the horizontal surfaces. Redeposition occurs as material 312 is sputtered from the cusp 308 in response to the impact of plasma ions along path 316. The sputtered material 312 follows a path 320 that encounters the sidewall 324 on the opposite side of the gap 304. This effect is symmetrical so that as material is sputtered away from the left side of the gap onto the right side, material is also sputtered away from the right side of the gap onto the left side. The redeposition of material protects against excess sputtering resulting in clipping of the corners.

Figure 3B:
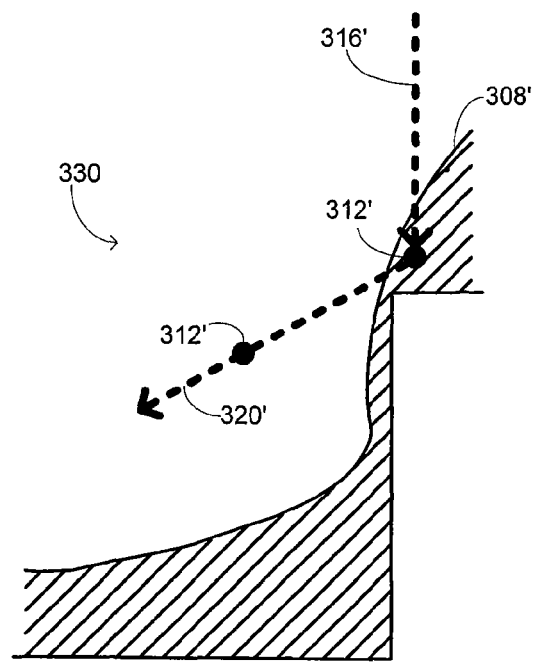

This symmetry is not present in the open areas, as illustrated with the open-area structure 330 shown in FIG. 3B. In this instance, the deposition causes the formation of a similar cusp 308', but when material 312' is sputtered along path 320' in response to the impact of plasma ions along path 316', the opposite side of the gap is too far away for the redeposition to be protective. The corner of the structure in FIG. 3B suffers the same ejection of material as does the corner of the structure in FIG. 3A, without the compensating effect of receiving material sputtered from the opposite side of the gap. As a consequence, there is an increased risk of clipping the corner and damaging the underlying structure.

In an embodiment of the invention, such corner clipping is avoided in open areas by using a process that has an initially high D/S ratio so that the initial part of the process is dominated by a greater deposition component and a reduced sputtering component. Subsequently, after some material has been deposited to protect the underlying structure, the D/S ratio is decreased so that the increased sputtering component keeps the gap open as material is deposited to complete gapfill. This decrease in D/S ratio during the process is used to address a combination of effects resulting from the use of a low-mass fluent gas in combination with a gap structure that does not benefit as strongly from redeposition effects. Such a decrease in D/S ratio is generally counter to more traditional gapfill techniques that increase the D/S ratio to improve gapfill with an initially aggressive gap.

Figure 4:
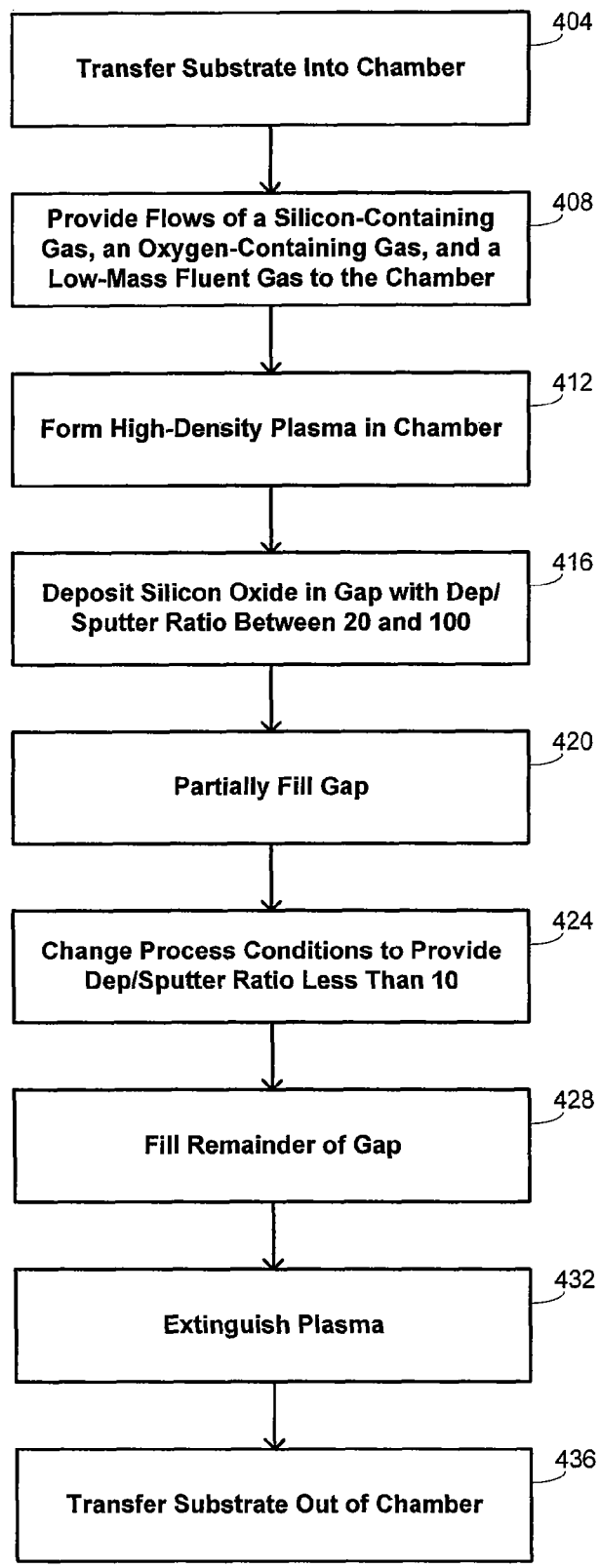
FIG. 4 is a flow diagram illustrating a method for depositing a film in one embodiment of the invention.

An exemplary process that uses this technique is illustrated with the flow diagram of FIG. 4. The process begins at block 404 by transferring a substrate into a process chamber. The substrate is typically a semiconductor wafer, such as a 200-mm or 300-mm-diameter silicon wafer. Flows of precursor gases are provided to the chamber at block 408, including a flow of a silicon-containing gas, a flow of an oxygen-containing gas, and a flow of a low-mass fluent gas. Table I provides exemplary flow rates for deposition of an undoped silicate glass ("USG") film using flows of monosilane $SiH_4$, molecular oxygen $O_2$, and $H_2$, although it should be understood that other precursor gases, including dopant sources, and other fluent gases that provide an average molecular mass less than 5 amu may be used as discussed above.

TABLE I

Exemplary Flow Rates for USG Deposition

| Flow Rates for 200-mm Wafer Process | | Flow Rates for 300-mm Wafer Process | |
|---|---|---|---|
| $F(SiH_4)$ | 10-60 sccm | $F(SiH_4)$ | 10-60 sccm |
| $F(O_2)$ | 20-120 sccm | $F(O_2)$ | 20-120 sccm |
| $F(H_2)$ | 400-1000 sccm | $F(H_2)$ | 750-1600 sccm |

As the table indicates, the flow rates of the precursor gases may be similar for 200-mm and 300-mm-diameter wafers, but the flow rate of the fluent gas is generally higher.

A high-density plasma is formed from the gaseous flows at block 412 by coupling energy into the chamber. A common technique for generating a high-density plasma is to couple rf energy inductively. The D/S ratio is determined not only by the flow rates for the gases, but also by the power density of energy coupled into the chamber, by the strength of a bias that may be applied to the substrate, by the temperature within the chamber, by the pressure within the chamber, and other such factors. For deposition of an initial portion of the film, such processing parameters are selected to provide a D/S ratio within the range of 20-100, as indicated at block 416. Deposition is permitted to proceed with such a D/S ratio to fill the gap partially, as indicated at block 420, with the process conditions being changed to provide a lower D/S ratio at block 424. In some embodiments, the gap is filled at block 420 so that its depth is reduced by less than 50% from its initial depth. For instance, if the gap had an initial depth of 5.4 µm, as might occur for a gap having an aspect ratio of 6:1 and a width of about 0.90 µm, the filling at block 420 might reduce the depth of the gap to about 3.3 µm, a reduction in the height of about 40%.

Suitable values for the D/S ratio to fill the remainder of the gap at block 428 are values less than 10, as indicated at block 424. These values are again determined by the processing parameters and provide an increased sputtering component to keep the gap open during deposition of the remainder of the film. After the gap has been filled, the plasma is extinguished at block 432 and the substrate is transferred out of the process chamber at block 436.

The process has thus been described as an in situ process taking place in a single chamber with a continuous plasma, but these are not requirements of the invention. In alternative embodiments, the plasma may be extinguished and reinitiated for different parts of the process and the different parts of the process may be performed in different chambers.

Figure 5:
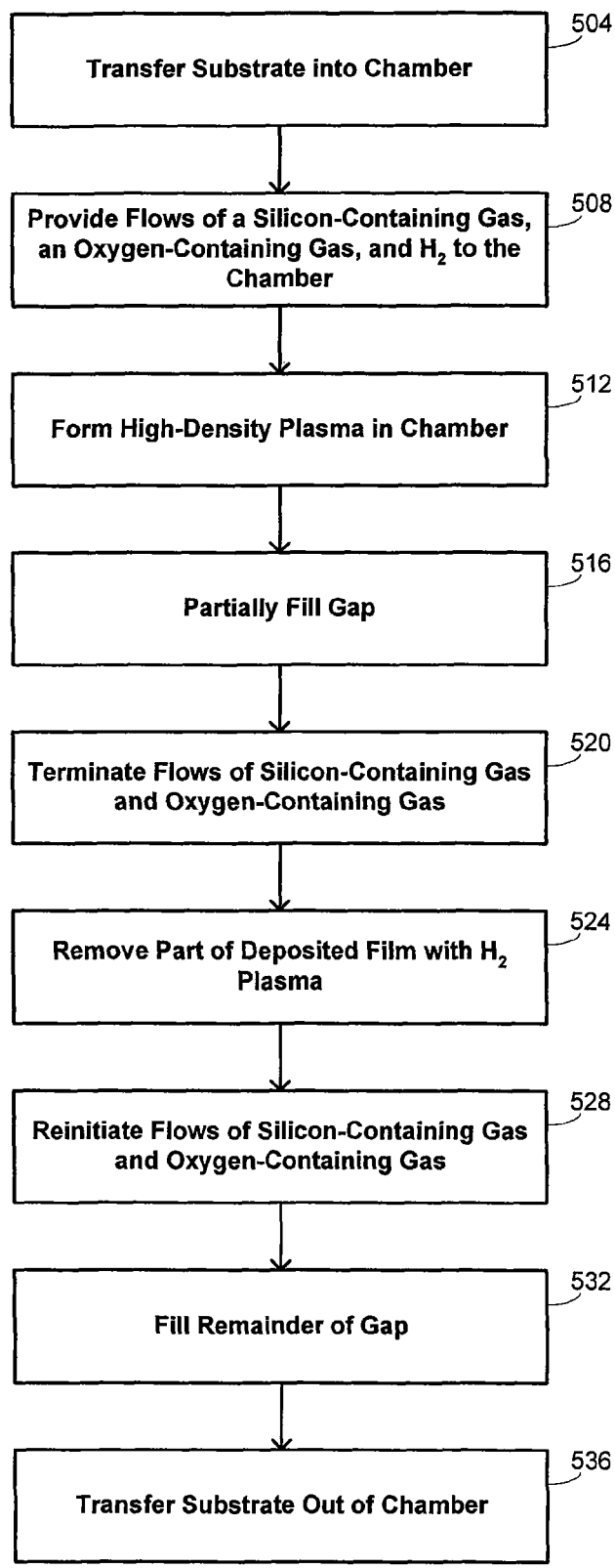
FIG. 5 is a flow diagram illustrating a method for depositing a film in another embodiment of the invention.

Another embodiment of the invention is illustrated with the flow diagram of FIG. 5 and makes use of an unexpected discovery by the inventors that a hydrogen plasma may be used to remove deposited silicon oxide. The removal proceeds chemically according to the reaction $SiO_2 + 2H_2 \rightarrow SiH_4 + O_2$ and provides a relatively slow removal rate of about 50-100 Å/min, even with a $H_2$ flow rate to the chamber on the order of 1000 sccm. This slow removal rate provides an improved degree of precision over the removal process that is not available with alternative removal processes, such as chemical etching processes based on halogen chemistry or mechanical processes that provide processing conditions with a low D/S ratio to sputter material aggressively. The use of halogen-based etch chemistries, such as result from plasmas formed from flows of $NF_3$, may cause undesirable stress on the chamber ceramics because of the formation of aluminum halogen byproducts such as $AlF_3$.

Figure 6:
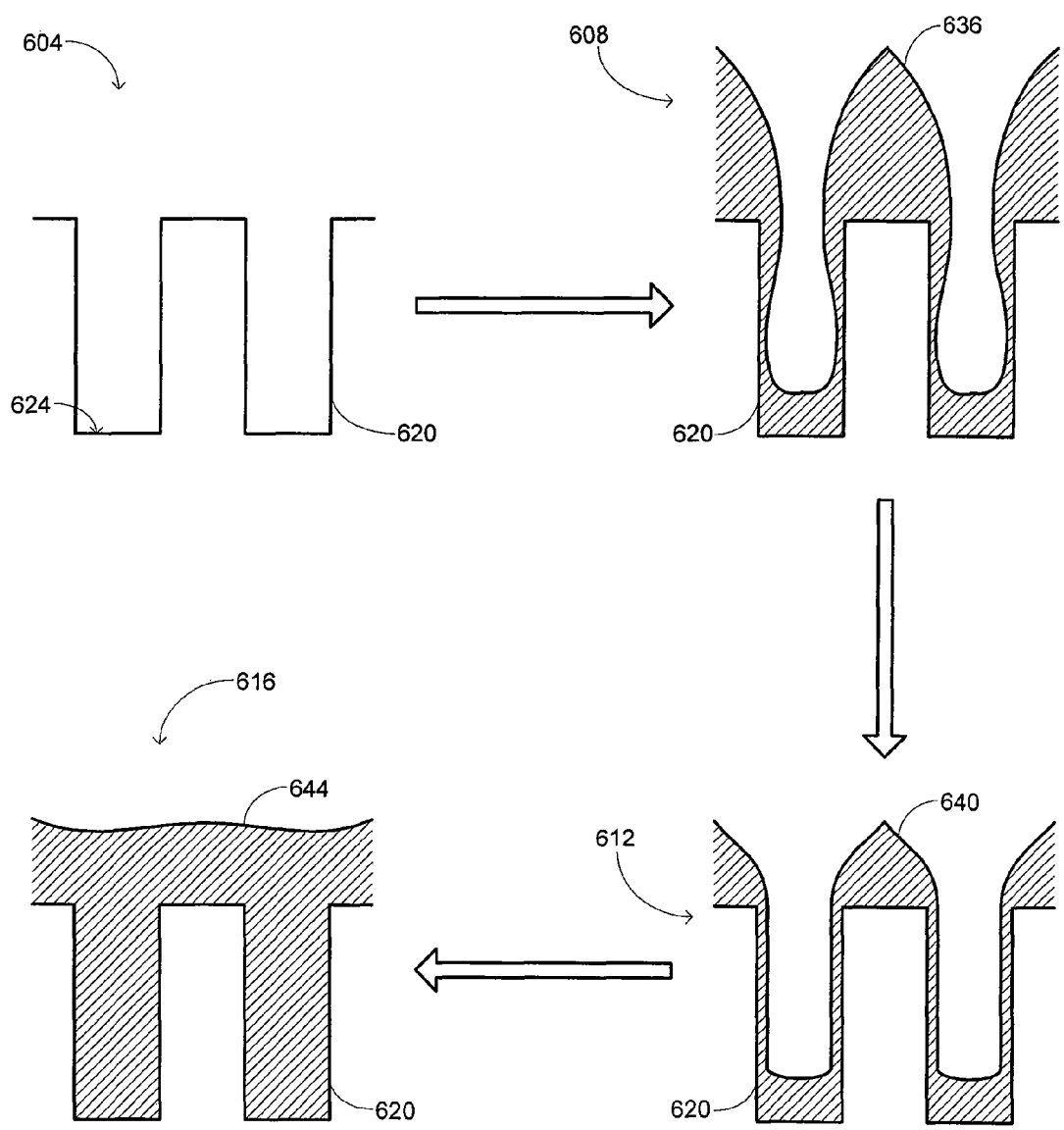
FIG. 6 provides schematic diagrams illustrating how material is deposited in a gap using the method of FIG. 5.

In describing these embodiments, reference is made simultaneously to the flow diagram of FIG. 5 and to FIG. 6, which provides simplified cross-sectional views of a structure at different points during the process described in connection with FIG. 5. The structure is shown as a substrate having trenches etched therein as part of an STI structure, but the principles described herein may be applied more generally to any structure that defines gaps to be filled, including IMD and PMD applications, among others. As shown in FIG. 5, the process starts by positioning a substrate in a process chamber at block 504. The substrate has an initial structure 604 shown schematically in FIG. 6 with features 620 that form one or more gaps to be filled. The features 620 may be, for example, areas of a substrate between etched trenches, adjacent metal lines, transistor gates, or other features. In some instances, the structure 604 may additionally include silicon nitride portions above the raised features and/or a silicon nitride liner along the interior of the gaps. The presence of such a line may increase the aspect ratio of the gap even further.

Once the substrate is properly positioned, flows of a silicon-containing gas like $SiH_4$, an oxygen-containing gas like $O_2$, and molecular hydrogen $H_2$ are provided to the chamber at block 508. A high-density plasma is formed from the gas flows by inductively coupling rf energy into the chamber at block 512, permitting the gap to be partially filled at block 516. As explained above, the deposition at block 516 results in the formation of a cusp 636, as shown for intermediate structure 608, with redeposition causing silicate glass to be deposited more thickly near the corners of the underlying structures than on the sidewalls.

To remove some of the deposited silicate glass and reshape the gap for further deposition, the flows of the precursor silicon-containing and oxygen-containing gases, as well as flows of any dopant gases that may have been supplied, are terminated at block 520. The removal of material results from the chemical interaction of the remaining hydrogen plasma to produce a further intermediate structure 612 that has a reduced cusp height 640 and a reshaped profile. While the principal removal mechanism results from the chemical interaction described above, it may be enhanced in certain embodiments. For instance, a bias may be applied to the substrate to attract the plasma ions and thereby introduce an anisotropy in the removal. Other anisotropies may be introduced by using different flows of the $H_2$ gas into the chamber to provide different flow characteristics throughout the chamber, allowing the removal to be performed selectively across the substrate as a whole. In addition, the plasma may comprise species other than hydrogen to increase the mechanical sputtering effect, although some embodiments of the invention generally remain limited to instances in which the average molecular weight of the sources is less than 5 amu.

Removal of material results in structure 612 by shaping the deposited film 640 so that the basic shape of the original features is retained, but with a less severe aspect ratio. After material has been removed to reopen the gap, flows of the precursor gases are reinitiated at block 528 so that the remainder of the gap may be filled at block 532 to produce structure 616 with film 644 providing substantially void-free gapfill. In many instances, the gap may be filled with two such deposition stages and a single intermediate removal stage, although more aggressive gaps may be filled with a greater number of interleaved deposition and removal stages. After the gap has been filled, the substrate is transferred out of the chamber at block 536.

Again, the process has been described as an in situ process in which the deposition and removal stages are performed in a single chamber with a continuous plasma. In other embodiments, the plasma may be extinguished between stages, with gas flows and other parameters being adjusted in preparation for the next phase, and a plasma being reformed. Such embodiments may also be performed as in situ processes in a single chamber (or in different chambers of a multichamber system), or may be performed as ex situ processes in different chambers. In some instances, in situ processes are preferred for throughput and performance reasons.

Figure 7A:
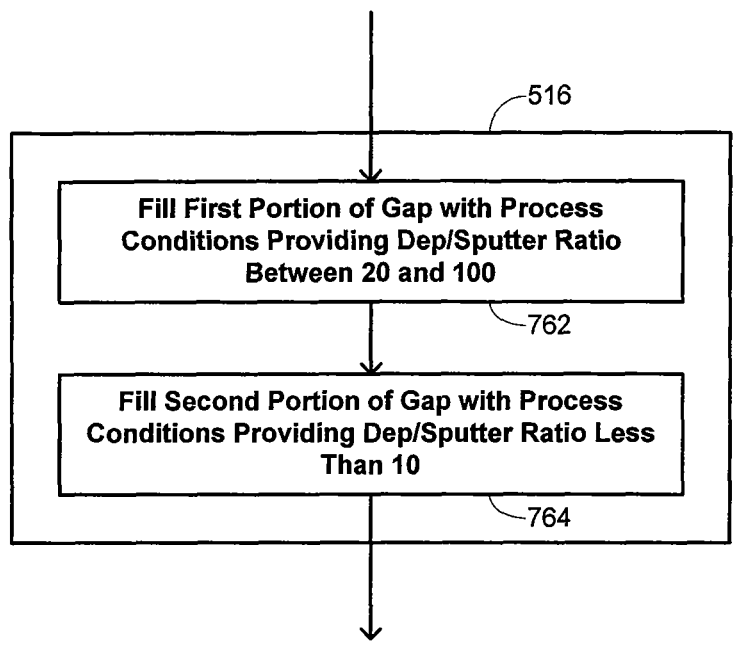
FIGS. 7A-7C are flow diagrams that illustrate alternative methods for depositing a film in other embodiments of the invention.
Figure 7B:
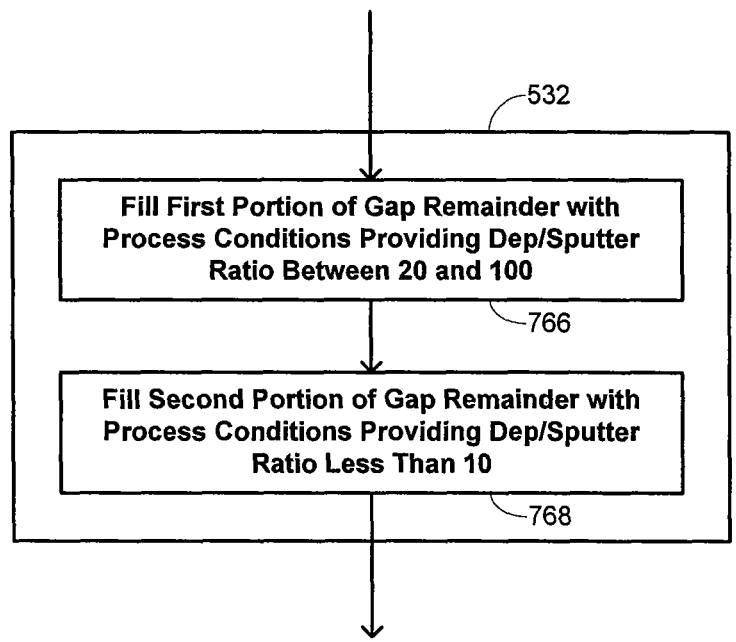
Figure 7C:
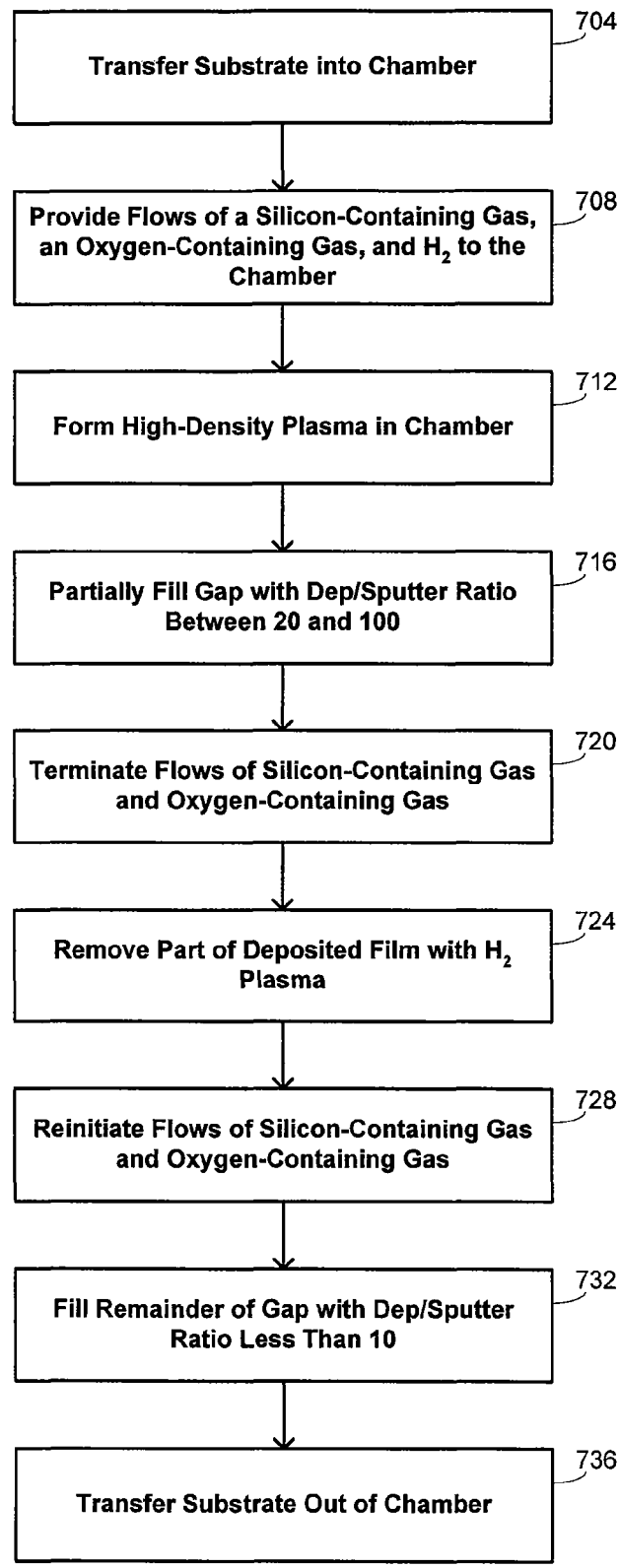

In other embodiments, the processes described in connection with FIG. 4 regarding the use of a decreasing D/S ratio and the processes described in connection with FIG. 5 regarding the chemical removal of silicate-glass material with a hydrogen-based plasma may be combined. FIGS. 7A-7C each provide flow diagrams that illustrate how the processes may be combined in different ways.

First, the change in D/S ratio used in FIG. 4 may be integrated with the process of FIG. 5 by having either or both of the depositions 516 and/or 532 use change in D/S ratio. Thus, FIG. 7A illustrates explicitly that block 516 of FIG. 5 may comprise a first block 762 at which a first portion of the gap is filled with process conditions that provide a D/S ratio between 20 and 100 and a second block 764 at which a second portion of the gap is thereafter filled with process conditions that provide a D/S ratio less than 10. The inclusion of such an initially high D/S ratio is useful in avoiding corner clipping in open areas for the same reasons that were described above.

FIG. 7B similarly illustrates explicitly that block 532 of FIG. 5 may comprise a first block 766 at which a first portion of the gap is filled with process conditions that provide a D/S ratio between 20 and 100 and a second block 768 at which a second portion of the gap is thereafter filled with process conditions that provide a D/S ratio less than 10. The inclusion of such a high D/S ratio after the removal of material at block 524 of FIG. 5 may be useful under circumstances where the amount of material removed poses a risk of corner clipping in open areas because of the presence of insufficient material to protect the corners.

FIG. 7C illustrates a process in which the high D/S ratio is used initially, thereby providing protection against corner clipping in open areas, but uses the lower D/S ratio after the removal of material by exposure to a hydrogen plasma. Such an embodiment is suitable in applications where the removal of material is not so aggressive as to present a risk of corner clipping, even in open areas, there being sufficient silicate glass material remaining even after the removal to protect the corners. To perform such a process as an in situ process with a continuous plasma, the substrate is transferred into the chamber at block 704 and flows of a silicon-containing gas, an oxygen-containing gas, and $H_2$ are provided at block 708 so that a high-density plasma may be formed in the chamber at block 712. The gap is partially filled at block 716 using process parameters that provide a D/S ratio between 20 and 100. Flows of the precursor silicon-containing and oxygen-containing gases are terminated at block 720 so that part of the deposited film may be removed with a hydrogen plasma at block 724. The flows of the precursor silicon-containing and oxygen-containing gases are reinitiated at block 728, and the process parameters are established so that the remainder of the gap is filled at block 732 with a D/S ratio less than 10.

After completing the gapfill process, the substrate is transferred out of the chamber at block 736.

Exemplary Substrate Processing System

Figure 8A:
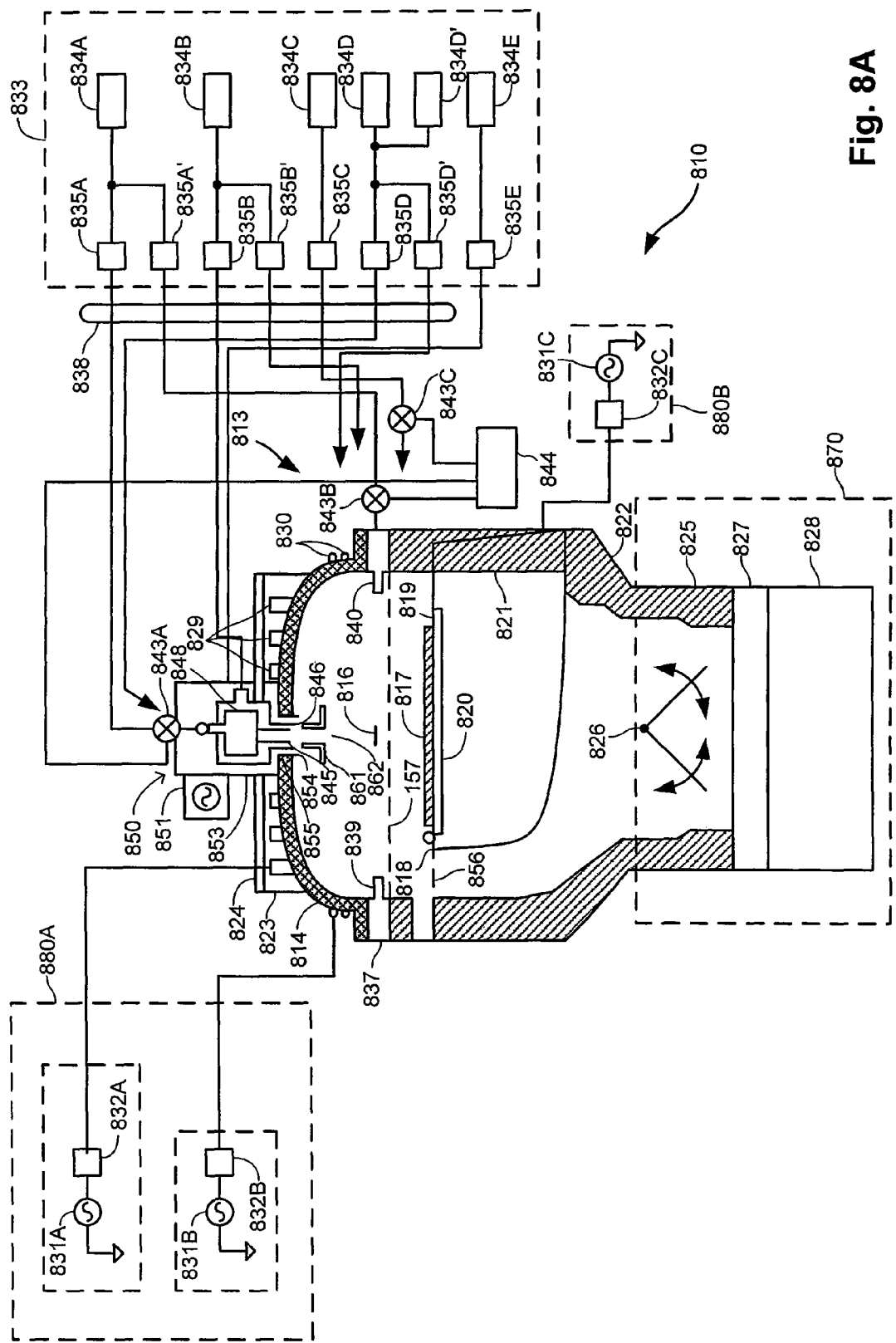
FIG. 8A is a simplified diagram of one embodiment of a high-density-plasma chemical-vapor-deposition system with which methods of the invention may be implemented.

The inventors have implemented embodiments of the invention with the ULTIMA™ system manufactured by APPLIED MATERIALS, INC., of Santa Clara, Calif., a general description of which is provided in commonly assigned U.S. Pat. No. 6,170,428, "SYMMETRIC TUNABLE INDUCTIVELY COUPLED HDP-CVD REACTOR," filed Jul. 15, 1996 by Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha, the entire disclosure of which is incorporated herein by reference. An overview of the system is provided in connection with FIGS. 8A and 8B below. FIG. 8A schematically illustrates the structure of such an HDP-CVD system 810 in one embodiment. The system 810 includes a chamber 813, a vacuum system 870, a source plasma system 880A, a bias plasma system 880B, a gas delivery system 833, and a remote plasma cleaning system 850.

The upper portion of chamber 813 includes a dome 814, which is made of a ceramic dielectric material, such as aluminum oxide or aluminum nitride. Dome 814 defines an upper boundary of a plasma processing region 816. Plasma processing region 816 is bounded on the bottom by the upper surface of a substrate 817 and a substrate support member 818.

A heater plate 823 and a cold plate 824 surmount, and are thermally coupled to, dome 814. Heater plate 823 and cold plate 824 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 813 includes a body member 822, which joins the chamber to the vacuum system. A base portion 821 of substrate support member 818 is mounted on, and forms a continuous inner surface with, body member 822. Substrates are transferred into and out of chamber 813 by a robot blade (not shown) through an insertion/removal opening (not shown) in the side of chamber 813. Lift pins (not shown) are raised and then lowered under the control of a motor (also not shown) to move the substrate from the robot blade at an upper loading position 857 to a lower processing position 856 in which the substrate is placed on a substrate receiving portion 819 of substrate support member 818. Substrate receiving portion 819 includes an electrostatic chuck 820 that secures the substrate to substrate support member 818 during substrate processing. In a preferred embodiment, substrate support member 818 is made from an aluminum oxide or aluminum ceramic material.

Vacuum system 870 includes throttle body 825, which houses twin-blade throttle valve 826 and is attached to gate valve 827 and turbo-molecular pump 828. It should be noted that throttle body 825 offers minimum obstruction to gas flow, and allows symmetric pumping. Gate valve 827 can isolate pump 828 from throttle body 825, and can also control chamber pressure by restricting the exhaust flow capacity when throttle valve 826 is fully open. The arrangement of the throttle valve, gate valve, and turbo-molecular pump allow accurate and stable control of chamber pressures up to about 1 millitorr to about 2 torr.

The source plasma system 880A includes a top coil 829 and side coil 830, mounted on dome 814. A symmetrical ground shield (not shown) reduces electrical coupling between the coils. Top coil 829 is powered by top source RF (SRF) generator 831A, whereas side coil 830 is powered by side SRF generator 831B, allowing independent power levels and frequencies of operation for each coil. This dual coil system allows control of the radial ion density in chamber 813, thereby improving plasma uniformity. Side coil 830 and top coil 829 are typically inductively driven, which does not require a complimentary electrode. In a specific embodiment, the top source RF generator 831A provides up to 2,500 watts of RF power at nominally 2 MHz and the side source RF generator 831B provides up to 5,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 880B includes a bias RF ("BRF") generator 831C and a bias matching network 832C. The bias plasma system 880B capacitively couples substrate portion 817 to body member 822, which act as complimentary electrodes. The bias plasma system 880B serves to enhance the transport of plasma species (e.g., ions) created by the source plasma system 880A to the surface of the substrate. In a specific embodiment, bias RF generator provides up to 10,000 watts of RF power at a frequency less than 5 MHz, as discussed further below.

RF generators 831A and 831B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 832A and 832B match the output impedance of generators 831A and 831B with their respective coils 829 and 830. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 8B:
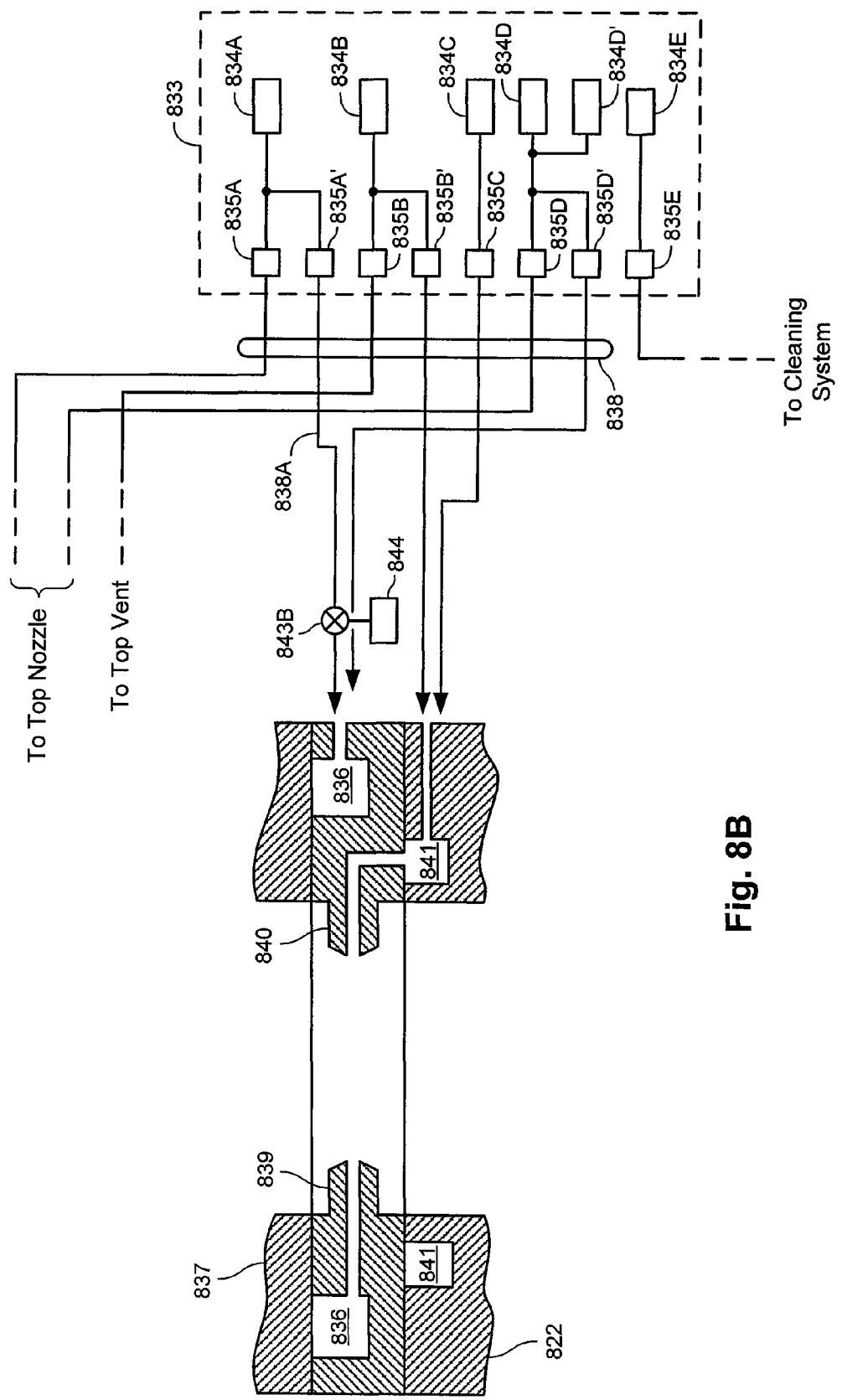
FIG. 8B is a simplified cross section of a gas ring that may be used in conjunction with the exemplary processing system of FIG. 8A.

A gas delivery system 833 provides gases from several sources, 834A-834E chamber for processing the substrate via gas delivery lines 838 (only some of which are shown). As would be understood by a person of skill in the art, the actual sources used for sources 834A-834E and the actual connection of delivery lines 838 to chamber 813 varies depending on the deposition and cleaning processes executed within chamber 813. Gases are introduced into chamber 813 through a gas ring 837 and/or a top nozzle 845. FIG. 8B is a simplified, partial cross-sectional view of chamber 813 showing additional details of gas ring 837.

In one embodiment, first and second gas sources, 834A and 834B, and first and second gas flow controllers, 835A' and 835B', provide gas to ring plenum 836 in gas ring 837 via gas delivery lines 838 (only some of which are shown). Gas ring 837 has a plurality of source gas nozzles 839 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 837 has 12 source gas nozzles made from an aluminum oxide ceramic.

Gas ring 837 also has a plurality of oxidizer gas nozzles 840 (only one of which is shown), which in a preferred embodiment are co-planar with and shorter than source gas nozzles 839, and in one embodiment receive gas from body plenum 841. In some embodiments it is desirable not to mix source gases and oxidizer gases before injecting the gases into chamber 813. In other embodiments, oxidizer gas and source gas may be mixed prior to injecting the gases into chamber 813 by providing apertures (not shown) between body plenum 841 and gas ring plenum 836. In one embodiment, third, fourth, and fifth gas sources, 834C, 834D, and 834D', and third and fourth gas flow controllers, 835C and 835D', provide gas to body plenum via gas delivery lines 838. Additional valves, such as 843B (other valves not shown), may shut off gas from the flow controllers to the chamber. In implementing certain embodiments of the invention, source 834A comprises a silane $SiH_4$ source, source 834B comprises a molecular oxygen $O_2$ source, source 834C comprises a silane $SiH_4$ source, source 834D comprises a helium He source, and source 834D' comprises a molecular hydrogen $H_2$ source.

In embodiments where flammable, toxic, or corrosive gases are used, it may be desirable to eliminate gas remaining in the gas delivery lines after a deposition. This may be accomplished using a 3-way valve, such as valve 843B, to isolate chamber 813 from delivery line 838A and to vent delivery line 838A to vacuum foreline 844, for example. As shown in FIG. 8A, other similar valves, such as 843A and 843C, may be incorporated on other gas delivery lines. Such three-way valves may be placed as close to chamber 813 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 8A, chamber 813 also has top nozzle 845 and top vent 846. Top nozzle 845 and top vent 846 allow independent control of top and side flows of the gases, which improves film uniformity and allows fine adjustment of the film's deposition and doping parameters. Top vent 846 is an annular opening around top nozzle 845. In one embodiment, first gas source 834A supplies source gas nozzles 839 and top nozzle 845. Source nozzle MFC 835A' controls the amount of gas delivered to source gas nozzles 839 and top nozzle MFC 835A controls the amount of gas delivered to top gas nozzle 845. Similarly, two MFCs 835B and 835B' may be used to control the flow of oxygen to both top vent 846 and oxidizer gas nozzles 840 from a single source of oxygen, such as source 834B. In some embodiments, oxygen is not supplied to the chamber from any side nozzles. The gases supplied to top nozzle 845 and top vent 846 may be kept separate prior to flowing the gases into chamber 813, or the gases may be mixed in top plenum 848 before they flow into chamber 813. Separate sources of the same gas may be used to supply various portions of the chamber.

A remote microwave-generated plasma cleaning system 850 is provided to periodically clean deposition residues from chamber components. The cleaning system includes a remote microwave generator 851 that creates a plasma from a cleaning gas source 834E (e.g., molecular fluorine, nitrogen trifluoride, other fluorocarbons or equivalents) in reactor cavity 853. The reactive species resulting from this plasma are conveyed to chamber 813 through cleaning gas feed port 854 via applicator tube 855. The materials used to contain the cleaning plasma (e.g., cavity 853 and applicator tube 855) must be resistant to attack by the plasma. The distance between reactor cavity 853 and feed port 854 should be kept as short as practical, since the concentration of desirable plasma species may decline with distance from reactor cavity 853. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 820, do not need to be covered with a dummy wafer or otherwise protected, as may be required with an in situ plasma cleaning process. In FIG. 8A, the plasma-cleaning system 850 is shown disposed above the chamber 813, although other positions may alternatively be used.

A baffle 861 may be provided proximate the top nozzle to direct flows of source gases supplied through the top nozzle into the chamber and to direct flows of remotely generated plasma. Source gases provided through top nozzle 845 are directed through a central passage 862 into the chamber, while remotely generated plasma species provided through the cleaning gas feed port 854 are directed to the sides of the chamber 813 by the baffle 861.

Those of ordinary skill in the art will realize that specific parameters can vary for different processing chambers and different processing conditions, without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method of depositing a silicon oxide film on a substrate disposed in a substrate processing chamber, the substrate having a gap formed between adjacent raised surfaces, the method comprising:

partially filling the gap with a silicon oxide layer deposited in a high density plasma chemical vapor deposition process that flows a silicon-containing gas, an oxygen-containing gas and molecular hydrogen into the substrate processing chamber, wherein a first portion of the gap is filled by depositing the silicon oxide layer under process conditions that provide a deposition/sputter ratio of between 20 and 100 and a second portion of the gap is filled by depositing the silicon oxide layer under process conditions that provide a deposition/sputter ratio of less than 10;

thereafter, removing a portion of the silicon oxide film to reshape the gap by stopping the flows of the silicon-containing and oxygen-containing gases and exposing the film to a high-density plasma formed with a flow of gases, including a flow of molecular hydrogen, having an average molecular weight less than 5 amu; and thereafter, depositing additional silicon oxide material into the gap with a high density plasma chemical vapor deposition process that flows a silicon-containing gas, an oxygen-containing gas and molecular hydrogen into the substrate processing chamber.

2. The method recited in claim 1 wherein the high density plasma in the step of removing a portion of the silicon oxide films is formed with a flow that consists essentially of molecular hydrogen $H_2$.

3. The method recited in claim 1 wherein the step of depositing additional silicon oxide materials into the gap comprises reinitiating the terminated flow of the silicon-containing gas and the terminated flow of the oxygen-containing gas.

4. The method recited in claim 1 wherein the flow of molecular hydrogen $H_2$ is provided at a rate greater than 500 sccm.

5. The method recited in claim 1 wherein the flow of molecular hydrogen $H_2$ is provided at a rate greater than 1000 sccm.

6. The method set forth in claim 1 wherein the gas comprises monosilane.

7. The method set forth in claim 6 wherein the oxygen-containing gas comprises molecular oxygen.

8. The method set forth in claim 1 wherein the step of depositing additional silicon oxide material into the gap fills the gap.

9. The method set forth in claim 1 wherein the step of depositing additional silicon oxide material into the gap comprises filling a third portion of the gap by depositing the silicon oxide layer under process conditions that provide a deposition/sputter ratio of between 20 and 100 and, thereafter, filling a fourth portion of the gap by depositing the silicon oxide layer under process conditions that provide a deposition/sputter ratio of less than 10.

10. The method set forth in claim 1 wherein the step of depositing additional silicon oxide material into the gap partially fills the gap.

11. The method set forth in claim 10 further comprising, after the step of depositing additional silicon oxide material into the gap to partially fill the gap, repeating the steps of removing a portion of the silicon oxide film and depositing additional silicon oxide material into the gap until the gap is filled.

* * * * *